United States Patent [19]

Ormond et al.

[11] Patent Number: 5,521,125
[45] Date of Patent: May 28, 1996

[54] PRECISION DICING OF SILICON CHIPS FROM A WAFER

[75] Inventors: Brian T. Ormond, Webster; Josef E. Jedlicka, Rochester, both of N.Y.

[73] Assignee: Xerox Corporation, Stamford, Conn.

[21] Appl. No.: 328,789

[22] Filed: Oct. 28, 1994

[51] Int. Cl.⁶ .................................................. H01L 21/78
[52] U.S. Cl. ............................................. 437/227; 437/226
[58] Field of Search ........................... 437/226, 227; 148/DIG. 28, DIG. 118

[56] References Cited

U.S. PATENT DOCUMENTS

| | | | |
|---|---|---|---|
| 3,924,323 | 12/1975 | Trevail et al. | 29/583 |
| 4,167,174 | 9/1979 | Hampton et al. | 125/13 R |
| 4,179,794 | 12/1979 | Kosugi et al. | 29/580 |
| 4,729,971 | 3/1988 | Coleman | 437/226 |
| 4,904,610 | 2/1990 | Shyn | 437/15 |
| 4,914,815 | 4/1990 | Takada et al. | 29/840 |
| 4,932,064 | 6/1990 | Kasahara | 382/8 |
| 4,997,793 | 3/1991 | McClurg | 437/226 |
| 5,024,970 | 6/1991 | Mori | 437/226 |
| 5,083,193 | 1/1992 | Heitzler et al. | 357/74 |
| 5,104,820 | 4/1992 | Go et al. | 437/51 |
| 5,136,354 | 8/1992 | Morita et al. | 437/226 |
| 5,157,001 | 10/1992 | Sakuma | 437/227 |
| 5,160,403 | 11/1992 | Fisher et al. | 156/633 |
| 5,214,657 | 5/1993 | Farnworth et al. | 371/40.1 |
| 5,266,528 | 11/1993 | Yamada | 437/226 |
| 5,284,792 | 2/1994 | Forster et al. | 437/226 |
| 5,286,343 | 2/1994 | Hui | 156/647 |
| 5,393,706 | 2/1995 | Mignardi et al. | 437/226 |

FOREIGN PATENT DOCUMENTS

| | | | |
|---|---|---|---|
| 62-20350 | 1/1987 | Japan | 437/227 |
| 2-45955 | 2/1990 | Japan | 437/227 |
| 5-267452 | 10/1993 | Japan | 437/227 |
| 6-151584 | 5/1994 | Japan | 437/227 |

*Primary Examiner*—George Fourson
*Assistant Examiner*—S. Mulpuri
*Attorney, Agent, or Firm*—R. Hutter

[57] ABSTRACT

A wafer design and dicing technique for creating semiconductor chips from wafers. A succession of oxide layers are deposited in first and second regions of a surface of a silicon substrate. The regions are separated by a street having no oxide layers therein, and the successive oxide layers form a vertical wall with a surface normal to the surface of the silicon substrate. A shock-absorbent material is deposited in the street, forming a concave meniscus therein. The shock-absorbent material retards the trajectories of silicon particles set into motion when the wafer is diced into chips.

5 Claims, 2 Drawing Sheets

PRECISION DICING OF SILICON CHIPS FROM A WAFER

The present invention relates to an invention for creating semiconductor silicon chips, particularly such chips having precision aligning surfaces, by cutting, or "dicing" such chips from a larger wafer.

Certain devices for the reading or recording of hard copy images, such as full-page-width ink-jet printheads or photosensitive arrays, are preferably designed with the precision portions thereof, such as the ink-jet ejectors or the photosensors and ancillary circuits, formed on silicon semiconductor chips. In either case of an ink-jet printhead or a photosensitive array, a currently favored design is to create the array from a plurality of relatively small silicon chips which are butted end-to-end to form a single full-page-width array. Such a design enables a number of relatively small chips to be tested individually, so that only acceptable chips are placed within the device. These chips are typically created from circular silicon wafers which are subsequently cut, or "diced," to form the chips.

In making semiconductor chips for these purposes, a persistent design challenge is to ensure consistent spacing between adjacent elements (ejectors or photosensors) of abutting chips. Such consistent spacing requires both a high-quality cut of the chip at each end thereof, and precise placement of the abutted chips in the apparatus. Particularly in the step of dicing the wafers to form the chips, any number of practical problems are encountered. Foremost among these problems are unintended damage to the end photosensors caused by microchipping of the silicon around the area of the dicing cut, damage to filter members placed on the chip caused by flying debris in the sawing process, and improper placement of the dicing cut itself. It is desirable to provide a wafer design or dicing technique wherein the risk of these defects is minimized.

U.S. Pat. No. 3,924,323 discloses a dicing technique for creating chips from a wafer. Grooves are made in the back of the wafer such that areas of the wafer corresponding to individual chips are separated. The grooves do not extend completely through the wafer. The grooves are filled with resin to isolate the chip areas.

U.S. Pat. No. 4,167,174 discloses a method and apparatus for aligning streets of a semiconductor wafer for sawing or scribing. The patent discloses methods for controlling the position of the cutting blade.

U.S. Pat. No. 4,179,794 discloses a semiconductor wafer dicing technique in which recessed grooves are formed into the wafer by an etching technique, along lines corresponding to the boundaries of adjacent chips. The surfaces of these etched grooves are coated with a resin, and the semiconductor is then severed into individual chips.

U.S. Pat. No. 4,729,971 discloses a dicing separation technique involving producing a depressed street pattern on the major surface of a wafer before thinning the wafer down to a desired thickness. After mounting the wafer on a suitable carrier, the wafer is selectively metallized to form backside contacts. Semiconductor material is removed from the central regions of the streets, and exposed material damaged by the material removal is also removed to eliminate microcracking.

U.S. Pat. No. 4,904,610 discloses a process for fabricating a number of semiconductor devices, in which electrodes are applied to both faces of a semiconductor wafer, and the wafer is mounted to a substrate with a layer of wax. The wafer is then divided by grooves which extend through the wafer and at least partially through the layer of wax. The wax is removed from the cured resin to provide a discrete flexible unit separate from the substrate.

U.S. Pat. No. 4,914,815 discloses a method for creating integrated circuits in which a plurality of circuit patterns formed on one side of a board, with a connecting film stuck on the other surface of the board. The board is then divided into portions while leaving the connecting film intact.

U.S. Pat. No. 4,932,064 discloses a semiconductor device in which two elements thereon having approximately the same area are sectionalized by a street, the street having an angle with respect to any scribe lines along which the semiconductor wafer is diced.

U.S. Pat. No. 4,997,793 and U.S. Pat. No. 5,053,836 disclose a chip-cleaving system in which a relatively wide scribing channel is provided between the ends of each adjacent pair of array areas on a wafer, to expose the epitaxial layer of the wafer. A scribing groove is then scribed in the scribing channel to define a cleavage line along which the array areas are separated.

U.S. Pat. No. 5,083,193 discloses a semiconductor package in which a plastic can is filled with cast resin and a chip, together with its leads and a synthetic resin cover, is inserted into the cast resin with portions of the leads engaging a groove in the can.

U.S. Pat. No. 5,104,820 discloses a dense electronic package in which a number of silicon chips are cut from wafers and stacked to form multilayer integrated circuit devices.

U.S. Pat. No. 5,160,403 discloses a technique for dicing chips for ink-jet printheads from a wafer. A precision dice cut is placed in the surface of the wafer closely adjacent to a component such as a heater resistor or ink channel. The precision cut extends only partially through the wafer and defines the buttable edge. A second dice cut, going all the way through the wafer, is parallel to and slightly offset from the precision dice cut. Only the edge formed by the precision dice cut is used to mount the chip in a printing apparatus.

U.S. Pat. No. 5,214,657 discloses a chip design technique wherein areas on the wafer are so designed so that certain sections of an integrated circuit chip in the wafer can be used as memory chips alone should the wafer as a whole fail a test.

U.S. Pat. No. 5,266,528 discloses a method of dicing a wafer by first cutting relatively shallow, wide grooves in the wafer, and then cutting the wafer along the shallow-wide grooves by use of a resin blade having a width smaller than that of the wide grooves.

U.S. Pat. No. 5,286,343 discloses a method of protecting corners of chips from undercutting during etching of the wafers. Protection masks abut the corner points of each chip and extend laterally from segments along the corner sides of the corner points forming lateral extensions.

According to one aspect of the present invention, there is provided a semiconductor wafer comprising a silicon substrate defining a surface. A plurality of oxide layers are disposed on the silicon substrate in a first region and a second region of the surface, the first and second regions being separated by a street having no oxide therein. The plurality of layers in each region form along a common border thereof a wall having a surface substantially normal to the surface of the silicon substrate.

According to another aspect of the present invention, there is provided a method of making silicon chips. A silicon substrate defining a surface is provided. A first layer of oxide is provided on a first region and a second region of a surface of the silicon substrate, the first region and second region being separated by a street having no oxide therein. A second layer of oxide is provided on the first region and the second region of the surface of the silicon substrate, the second layer of oxide and the first layer of oxide sharing a common border in each of the first region and the second region along the street. The first and second layers in each region form along a common border thereof a wall having a surface substantially normal to the surface of the silicon substrate. The silicon substrate is then sawn along the street.

BRIEF DESCRIPTION OF THE DRAWINGS

In the drawings:

FIG. 1 is a perspective view showing in isolation a typical silicon-based semiconductor wafer 10. Such wafers include a base silicon substrate of approximately 500 micrometers in thickness for a wafer 100 nm in diameter, or, according to another common design, 625 micrometers in thickness for a wafer 125 mm in diameter. Such a wafer is typically divided into areas corresponding to individual chips to be cut from the wafer, and such chips are typically of dimensions from ¼ inch to 1 inch on any given side. In order to create the desired circuitry on the chips formed by the wafer, various levels of oxides, such as metal or glass oxides, are placed in succession on one main surface of the silicon wafer, in a manner known in the art. The cumulative thickness of such oxide layers forming circuitry on the wafer 10 is approximately 6 micrometers.

FIG. 2 is a sectional elevational view showing a portion of the top surface of wafer 10, in an area thereof at a boundary between two chip areas 12, which are shown in FIG. 2 as 12a and 12b respectively. (In FIG. 2 the overall thickness of the main substrate of wafer 10 is not shown to scale.) As is known in the art, when chips are formed in a silicon wafer, different discrete areas of the wafer are deposited with the necessary oxide layers to form the chip of the desired design and then these parts of the wafer corresponding to these discrete areas are scribed, cleaved, or otherwise cut therethrough to form the individual chips. According to the present invention, such chip areas shown as 12a and 12b in FIG. 1 are formed on the substrate provided by silicon wafer 10 so that their effective areas do not actually touch each other. Rather, the two chip areas 12a and 12b are separated by a "street" indicated as 14. Street 14 is defined as an area between the chip areas 12a and 12b in which no oxide layers characteristic of the chip areas are apparent; preferably, the street 14 defines an area in which the bare silicon of wafer 10 is exposed.

As seen in FIG. 2, street 14 is created by the successive application of individual oxide layers 20 in each chip area 12a and 12b. As is known in the art of chip-making, each individual layer of metal or glass oxide 20 for the entire wafer 10 is created by first placing a uniform layer of the oxide over the substrate provided by wafer 10, and then, in an etching process, selectably removing portions of the uniform layer in a configuration consistent with the desired circuitry corresponding to the layer. To create street 14, an individual first layer of oxide is placed on the wafer, and then the portion of the uniform layer corresponding to the area of street 14 is removed along with the other circuitry-related portions of the layer within each chip area 12a, 12b. Only after a first such layer 20 for each chip area 12a and 12b is formed is a second or subsequent oxide layer formed on the wafer 10, with the uniform layer for the second layer placed directly over the already-formed first layer. Once again, for the second layer, the portion of the uniform layer corresponding to the area of street 14 is removed along with the other circuitry-related portions of the second layer within each chip area 12a, 12b. This process is repeated as necessary for all subsequent oxide layers, always completely forming the under-layer (particularly, removing the portion of the layer corresponding to street 14) before applying the uniform layer for the next layer. It is important that the layers 20 share a common border along street 14.

Figure 1:
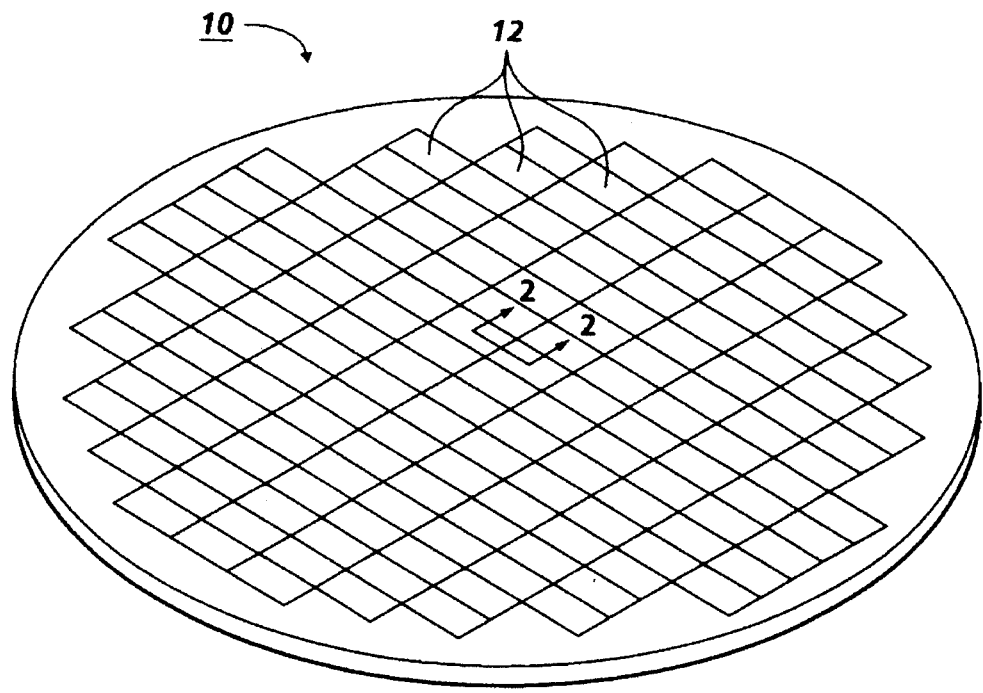
FIG. 1 is a perspective view of a semiconductor wafer which may be diced according to the present invention.

Because of the depositing of individual oxide layers 20 in a successive manner as described, the edges of the oxide layers 20 collectively form walls 21 along the common borders thereof which are substantially normal to the surface of the silicon 10.

The technique of the present invention, in which the areas corresponding to street 14 are denuded of oxide at each successive step of creating an oxide layer, is distinguishable from a process in which a plurality of oxide layers 20 are deposited in the area of street 14 and then collectively removed in a single step. A technique of etching multiple layers of oxide down to the silicon 10 will not create the desired relationship between the surface of silicon 10 in street 14 and the vertical walls formed by the oxides. Furthermore, such a multilayer etching is likely to eat into the surface of silicon wafer 10 in street 14, which will create an undesirable curved profile to the street 14 and walls 21 as opposed to the desired rectangular profile shown in FIG. 2. This rectangular profile is useful for accurate placement of the chip when the chip is abutted or otherwise installed in a machine. If the chip is left with a curved edge, as is likely to occur if a single multilayer street-etching step is used, the dimensions of the formed chip will not be readily predictable, and accurate installation of the chip in a machine will be difficult.

One optional design variation is to include a "sidewalk" in the form of a polysilicon layer 22 between the top surface of silicon wafer 10 and the bottom oxide layer 20, which juts out a small distance into the street 14. Such a sidewalk 22 may add to the structural stability of the oxides in chip areas 12a and 12b. Typically, a suitable distance for the jutting out of sidewalk 22 from a vertical wall formed by oxide layers 20 is approximately 0.5 micrometers or less. Similarly, a polysilicon layer may be provided on top of the collective oxide layers 20 in each chip area, as shown as 24 in FIG. 2.

Particularly for the application of such chips in photosensitive devices, the chip areas 12a, 12b may include a light shield layer, here shown as 28, which may include, for example, one or more color filter layers of a plastic material such as polyimide.

Figure 3:
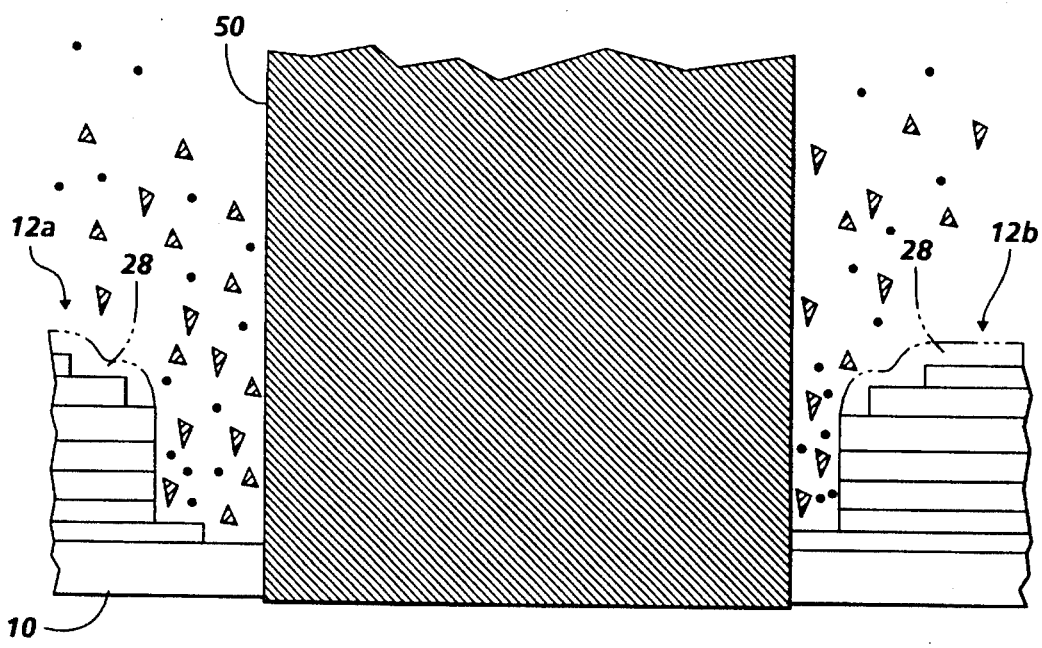
FIG. 3 is similar sectional elevational view as in FIG. 2, showing a subsequent step in the method of the present invention.

FIG. 3 shows the behavior of a dicing blade 50, here shown in section, as it cuts through the silicon wafer 10 in the dicing process. Such a dicing blade is typically in the form of a circular saw blade, made of a nickel electroform or resin having diamond particles suspended therein. Such a dicing blade includes an abrasive surface both along the edge thereof and also on the main surfaces thereof. A typical dicing blade according to design rules known in the art is approximately 80 micrometers thick; such a blade is preferably applied to a wafer 10 wherein the streets 14 formed therein are 100 micrometers across; that is, the spacing between adjacent borders of chip areas 12a and 12b should be approximately 100 micrometers.

As shown in FIG. 3, dicing blade 50 is preferably placed toward one chip area 12b, and in particular may engage a surface thereof very close to, or in contact with, the polysilicon sidewalk 22 jutting out from the vertical wall 21 formed by the succession of oxide layers 20. As shown in FIG. 3, by coming into close proximity to the sidewalk 22, a noticeable gap should exist between the main surface of dicing blade 50 and the vertical wall formed by the oxide layers 20 of chip area 12b. This arrangement effectively insulates the various oxide and other layers of the various chip areas 12a and 12b from the most destructive effects of flying silicon debris caused by the action of dicing blade 50.

Figure 4:
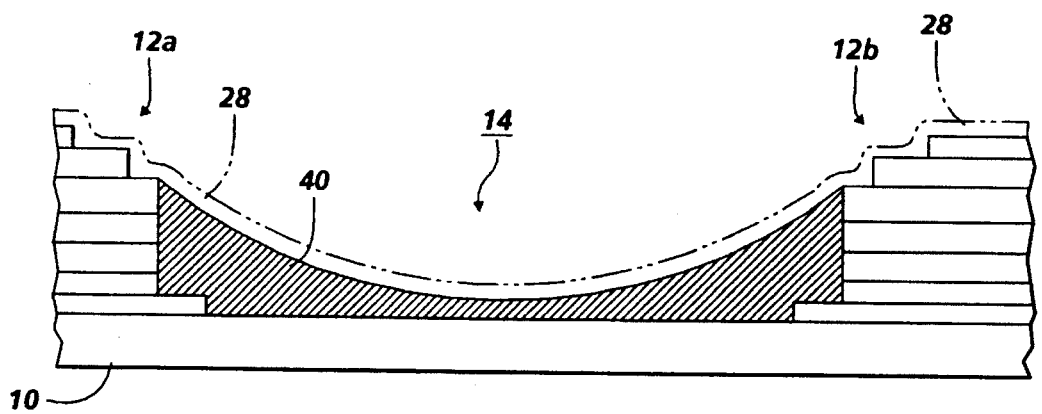
FIG. 4 is similar sectional elevational view as in FIG. 2, showing a variation in the method and wafer of the present invention.

FIG. 4 shows another variation on the method of the present invention, wherein a barrier layer of shock-absorbent material, here shown as 40, is applied into the street 14. The material for the shock-absorbent barrier 40 is preferably polyimide plastic deposited only in the area of street 14, in such a manner as to form a concave meniscus as shown. It is desirable that the material forming shock-absorbent barrier layer 40 would have a lower surface tension when cured than that of the oxide layers, to obtain the concave meniscus. The shock-absorbent material retards the trajectories of silicon particles set into motion by the action of dicing blade 50, further ensuring minimal damage to the circuitry to chip areas 12a or 12b.

Figure 2:
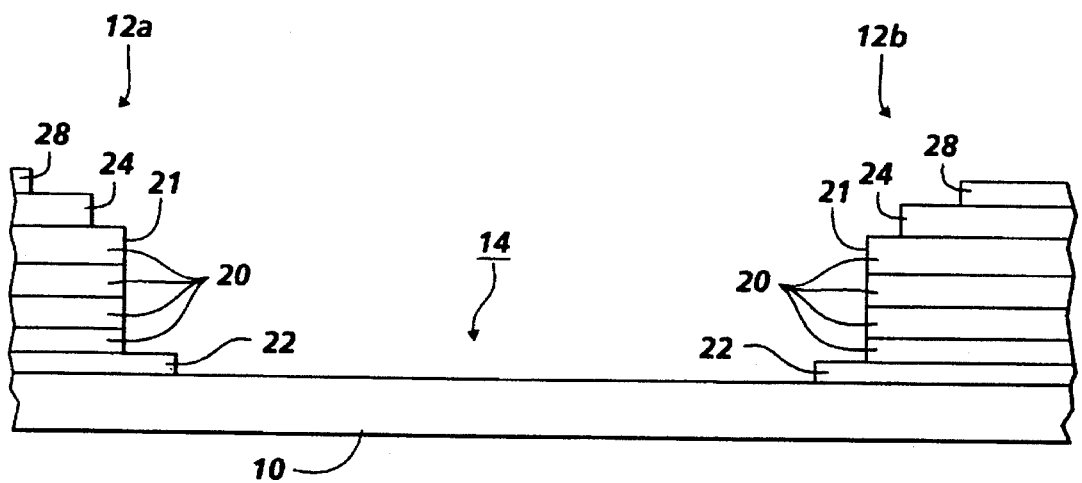
FIG. 2 is a sectional elevational view through a top surface of the wafer, along the lines 2—2 in FIG. 1.

Further as shown in FIG. 4, if it is desired to create chips, such as photosensitive chips, having one or more polyimide filter layers thereon, as shown as layers 28 in FIG. 2 above, it is a common practice to create these light shields 28 by uniformly coating the undiced wafer with the desired polyimide material, and then leaving the light shield material on the wafer as the wafer is being diced. The presence of the shock-absorbent barrier layer 40 need not interfere with the presence of one or more light shield layers 28. As shown in FIG. 4, such a light shield layer 28 can be placed right over the shock-absorbent barrier layer 40. The interaction of the polyimide of the light shield layer 28 with the polyimide of shock-absorbent layer 40 is unimportant, since both such layers in street 14 are effectively removed in the dicing process.

While this invention has been described in conjunction with various embodiments, it is evident that many alternatives, modifications, and variations will be apparent to those skilled in the art. Accordingly, it is intended to embrace all such alternatives, modifications, and variations as fall within the spirit and broad scope of the appended claims.

We claim:

1. A method of making silicon chips, comprising the steps of:

providing a silicon substrate defining a surface;

depositing a first layer of oxide on a first region and a second region of a surface of the silicon substrate, the first region and second region being separated by a street having no oxide from the first layer of oxide therein;

depositing a second layer of oxide on the first region and the second region of the surface of the silicon substrate, the second layer of oxide and the first layer of oxide sharing a common border in each of the first region and the second region along the street, wherein the first and second layers in each region form along a common border thereof a wall having a surface substantially normal to the surface of the silicon substrate;

depositing shock-absorbent material in the street, the shock-absorbent material forming a concave meniscus in the street, the concave meniscus extending from a top of a layer of oxide in the first region to a top of a layer of oxide in the second region, wherein the shock-absorbent material directly contacts to the surface of the silicon substrate; and then sawing the silicon substrate along the street.

2. The method of claim 1, wherein the street is not less than 80 micrometers in width between the first region and the second region.

3. The method of claim 1, the sawing step including making a cut in the silicon substrate narrower than a width of the street between the first region and second region.

4. The method of claim 1, further comprising the step of depositing a layer of polysilicon on the substrate so that the layer of polysilicon is disposed between the silicon substrate and the layer of oxide in the first region, the layer of polysilicon extending a distance from a border of the first region into the street.

5. The method of claim 1, further comprising the step of depositing a light-shield layer over the shock-absorbent material.

\* \* \* \* \*